(12) United States Patent
Hasegawa et al.

(10) Patent No.: US 9,553,084 B2
(45) Date of Patent: Jan. 24, 2017

(54) SWITCHING ELEMENT, SEMICONDUCTOR DEVICE, AND SEMICONDUCTOR DEVICE MANUFACTURING METHOD

(71) Applicant: Mitsubishi Electric Corporation, Tokyo (JP)

(72) Inventors: Shigeru Hasegawa, Tokyo (JP); Kazuhiro Morishita, Tokyo (JP); Takeshi Kitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/897,797

(22) PCT Filed: Sep. 9, 2013

(86) PCT No.: PCT/JP2013/074284
§ 371 (c)(1),
(2) Date: Dec. 11, 2015

(87) PCT Pub. No.: WO2015/033476
PCT Pub. Date: Mar. 12, 2015

(65) Prior Publication Data
US 2016/0148927 A1    May 26, 2016

(51) Int. Cl.
*H01L 27/06* (2006.01)
*H01L 21/66* (2006.01)
(Continued)

(52) U.S. Cl.
CPC ......... *H01L 27/0629* (2013.01); *H01L 21/52* (2013.01); *H01L 21/823475* (2013.01);
(Continued)

(58) Field of Classification Search
CPC ............ H01L 2924/0002; H01L 2924/00; H01L 29/0696; H01L 29/7803; H01L 21/52
(Continued)

(56) References Cited

U.S. PATENT DOCUMENTS 5,642,252 A * 6/1997 Sakamoto ........... H01L 27/0248
257/E29.257
2007/0210350 A1 9/2007 Omura et al.
(Continued)

FOREIGN PATENT DOCUMENTS

JP    H03-179779 A    8/1991
JP    H07-058293 A    3/1995
(Continued)

OTHER PUBLICATIONS

International Search Report; PCT/JP2013/074284; mailed Nov. 26, 2013.
(Continued)

*Primary Examiner* — David Vu
*Assistant Examiner* — Jonathan Han
(74) *Attorney, Agent, or Firm* — Studebaker & Brackett PC

(57) ABSTRACT

According to the present invention, a switching element includes a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad. Thus, measurement of the gate resistance value and selection from gate resistances of the switching element can be performed after the completion of the gate-resistor-incorporating-type switching element.

14 Claims, 5 Drawing Sheets

(51) Int. Cl.
*H01L 27/10* (2006.01)
*H01L 29/78* (2006.01)
*H01L 29/16* (2006.01)
*H01L 29/20* (2006.01)
*H01L 21/52* (2006.01)
*H01L 21/8234* (2006.01)
*H01L 23/522* (2006.01)
*H01L 23/528* (2006.01)
*H01L 49/02* (2006.01)
*H01L 29/423* (2006.01)
*H01L 29/739* (2006.01)

(52) U.S. Cl.
CPC ............ *H01L 22/20* (2013.01); *H01L 23/528* (2013.01); *H01L 23/5228* (2013.01); *H01L 27/101* (2013.01); *H01L 28/20* (2013.01); *H01L 29/1602* (2013.01); *H01L 29/1608* (2013.01); *H01L 29/2003* (2013.01); *H01L 29/4232* (2013.01); *H01L 29/7803* (2013.01); *H01L 29/7817* (2013.01); *H01L 29/7395* (2013.01); *H01L 2924/0002* (2013.01)

(58) Field of Classification Search
USPC .................. 257/E21.384, E29.013, E29.027, 257/E29.122, E29.201, E29.257, 287, 257/379, 76, 77
See application file for complete search history.

(56) References Cited

U.S. PATENT DOCUMENTS

2012/0242390 A1* 9/2012 Montalbo ............. H02M 7/219
327/324
2014/0312416 A1* 10/2014 Miyakoshi .......... H01L 29/4983
257/337

FOREIGN PATENT DOCUMENTS

| JP | H08-116049 A | 5/1996 |
| JP | 2005-032736 A | 2/2005 |
| JP | 2007-273931 A | 10/2007 |
| JP | 2008-147785 A | 6/2008 |

OTHER PUBLICATIONS

Notification of Transmittal of Translation of the International Preliminary Report on Patentability and Translation of Written Opinion of the International Searching Authority; PCT/JP2013/074284 issued on Mar. 24, 2016.

An Office Action; "Notice of Reasons for Rejection," issued by the Japanese Patent Office on Jun. 7, 2016, which corresponds to Japanese Patent Application No. 2015-535278 and is related to U.S. Appl. No. 14/897,797; with English language partial translation.

* cited by examiner

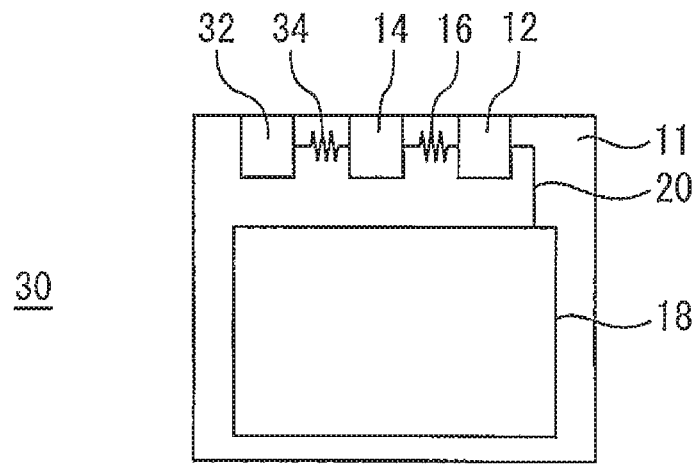
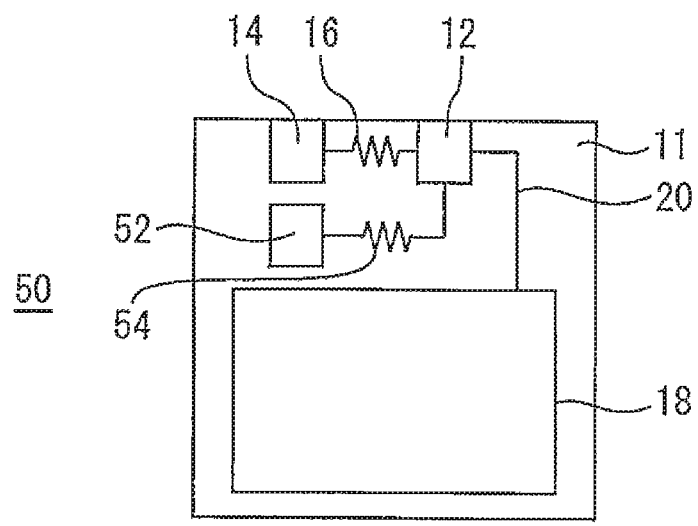

SWITCHING ELEMENT, SEMICONDUCTOR DEVICE, AND SEMICONDUCTOR DEVICE MANUFACTURING METHOD

TECHNICAL FIELD

This invention relates to a switching element which switches between conducting a current and shutting off the current according to a control signal externally supplied, a semiconductor device having the switching element and a method of manufacturing the semiconductor device.

BACKGROUND ART

Patent Literature 1 discloses a switching element incorporating a gate resistor. This switching element has a plurality of resistor regions below a gate pad. The plurality of resistor regions and the gate are connected in a suitable way in the final step in the wafer process, thereby obtaining a desired gate resistance.

PRIOR ART

Patent Literature

Patent Literature 1: Japanese Patent Laid-Open No. H3-179779

SUMMARY OF INVENTION

Problems to be Solved by the Invention

In some cases, a semiconductor device having a rated current of several tens to several thousands of amperes is manufactured by connecting a plurality of switching elements in parallel with each other. If gate resistances for switching elements in such a semiconductor device vary, the switching speed and the on-state current value also vary. This is a cause of oscillation or degradation of the switching elements. It is, therefore, desirable to construct a gate-resistor-incorporating-type switching element so that it is possible to check that the gate resistance value meets a standard.

In the above-described semiconductor device, the number of switching elements mounted in parallel with each other is increased if the rated current is increased, and the number of switching elements mounted in parallel with each other is reduced if the rated current is reduced. Also, if the number of switching elements mounted in parallel with each other is changed, the optimum value of the gate resistance value for inhibiting gate oscillation or reducing control signal unbalance changes. It is, therefore, desirable to enable selecting from gate resistances in a gate-resistor-incorporating-type switching element after the completion of the switching element so that the switching element can be adapted to a plurality of models.

The present invention has been achieved to solve the above-described problems, and an object of the present invention is to provide a switching element capable of measuring the gate resistance value and selecting from gate resistances after the completion of a gate-resistor-incorporating-type switching element, a semiconductor device having the switching element and a method of manufacturing the semiconductor device having the switching element.

Means for Solving the Problems

According to the present invention, there is provided a switching element including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad.

According to the present invention, there is provided a semiconductor device including a first switching element including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad, and a second switching element having the same configuration as the first switching element, the second switching element is connected in parallel with the first switching element, and a wire for transmitting control signal, the wire is connected to the first gate pad of the first switching element and the first gate pad of the second switching element or to the second gate pad of the first switching element and the second gate pad of the second switching element.

According to the present invention, there is provided a method of manufacturing a semiconductor device including a step of manufacturing a switching element including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad, a step of measuring the resistance value of the first resistor portion by setting probes to the first gate pad and the second gate pad, and a step of mounting the switching element in a module if the resistance value meets a standard.

Other features of the present invention will become clear from the following description.

Advantageous Effects of Invention

According to the present invention, measurement of the gate resistance value and selection from gate resistances can be performed after the completion of the gate-resistor-incorporating-type switching element.

BRIEF DESCRIPTION OF DRAWINGS

FIG. 6 is a plan view of a switching element according to Embodiment 2 of the present invention.

FIG. 7 is a plan view of a switching element according to Embodiment 3 of the present invention.

DESCRIPTION OF EMBODIMENTS

Figure 1:
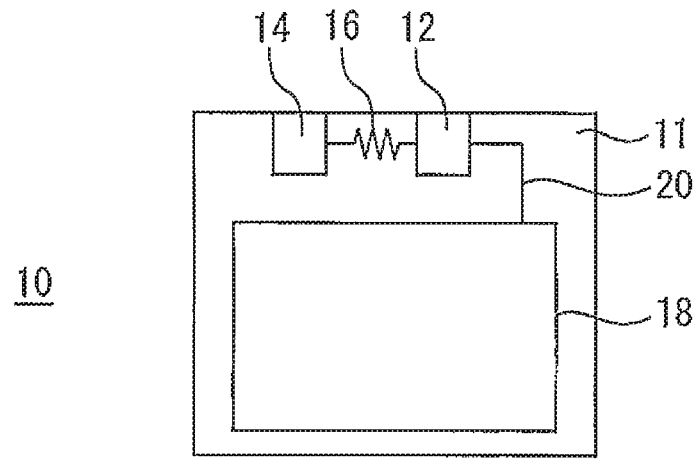
FIG. 1 is a schematic plan view of a switching element according to Embodiment 1 of the present invention.

A switching element, a semiconductor device and a semiconductor device manufacturing method according to an embodiment of the present invention will be described with reference to the drawings. Components identical or corresponding to each other are assigned the same reference characters and repeated description of them is omitted in some cases.

Embodiment 1

FIG. 1 is a schematic plan view of a switching element 10 according to Embodiment 1 of the present invention. The switching element 10 is an IGBT. The switching element 10 includes a substrate 11. A first gate pad 12 and a second gate pad 14 are formed on the substrate 11. A first resistor portion 16 which connects the first gate pad 12 and the second gate pad 14 to each other is formed on the substrate 11. The first resistor portion 16 is a gate resistor incorporated in the switching element 10. The first resistor portion 16 includes a high-resistance layer formed by a wafer process. A gate resistor incorporated in a switching element is referred to as an on-chip resistor in some cases. The first resistor portion 16 in the figure is indicated by a circuit symbol.

A cell region 18 is formed on the substrate 11. The cell region 18 has a gate wiring portion through which a control signal is received. The gate wiring portion of the cell region 18 is connected to the first gate pad 12 by wiring 20.

A method of manufacturing a semiconductor device according to Embodiment 1 of the present invention will subsequently be described. First, the switching element 10 is manufactured by the wafer process. Next, the resistance value of the first resistor portion 16 is measured by setting probes (terminals for measurement) to the first gate pad 12 and the second gate pad 14. Subsequently, if the resistance value meets a standard, the switching element 10 is mounted in a module. An aluminum wire which is used for gate wiring and through which a control signal externally supplied is transmitted is fixed to the first gate pad 12 or the second gate pad 14. A wire having electrical conductivity other than an aluminum wire may alternatively be used.

If the resistance value of the first resistor portion 16 does not meet the standard, the switching element 10 is discarded without being mounted in the module. The amount of damage can thus be reduced in comparison with a case where after mounting the switching element 10, the fact that the resistance value of the first resistor portion 16 does not meet the standard is found and the entire semiconductor device is discarded.

Since the first resistor portion 16 is formed by the wafer process, variations in resistance value due to variations in process conditions cannot be avoided. There is, therefore, a need to check that the resistance value of the first resistor portion 16 meets the standard. In the switching element 10 according to Embodiment 1 of the present invention, the resistance value of the first resistor portion 16 can be measured by bringing the probes into contact with both the first gate pad 12 and the second gate pad 14. It is, therefore, possible to check that the resistance value of the first resistor portion 16 meets the standard.

In particular, in a case where a plurality of switching elements are connected in parallel to each other in a semiconductor device, variations in resistance value between the switching elements can be limited by checking that the resistance value (gate resistance value) meets the standard as described above. As a result, the semiconductor device can be stably operated without current concentration on any of the plurality of switching elements. In a case where the number of switching elements provided in parallel with each other in a semiconductor device is large, or in a case where a semiconductor device switches at a high frequency, there is a need to uniformize the gate resistance values of the switching elements in the semiconductor device with accuracy. In such a case, it is preferable to select switching elements having gate resistance values in the desired range on the basis of the gate resistance values of the switching elements measured in the above-described way and to mount the selected switching elements in one semiconductor device. That is, a plurality of switching elements are manufactured; resistance value measurements are made on them; some of the plurality of switching elements having resistance values within the desired range are selected; and the selected switching elements are mounted in one semiconductor device. The high-performance semiconductor device can thus be obtained with efficiency.

Figure 2:
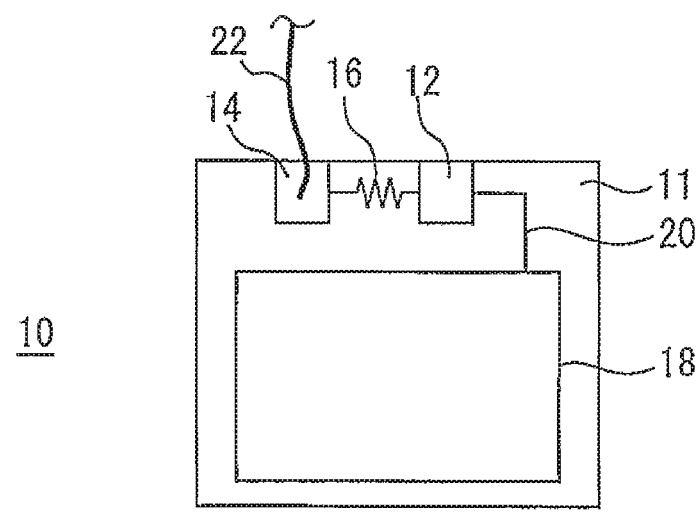
FIG. 2 is a plan view of an aluminum wire fixed to the second gate pad.
Figure 3:
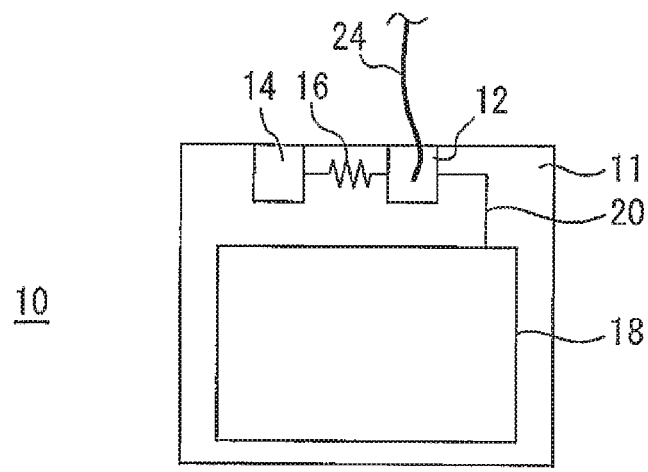
FIG. 3 is a plan view of an aluminum wire fixed to the first gate pad.

Further, it is possible to select to which of the first gate pad 12 and the second gate pad 14 an aluminum wire through which a control signal externally supplied is transmitted is fixed. FIG. 2 is a plan view of an aluminum wire 22 fixed to the second gate pad 14. The aluminum wire 22 is connected to the second gate pad 14 to enable the first resistor portion 16 to be used as an on-chip resistor. FIG. 3 is a plan view of an aluminum wire 24 fixed to the first gate pad 12. When the aluminum wire 24 is connected to the first gate pad 12, the switching element can be formed with no on-chip resistor.

Switching elements 10 can be adapted to a plurality of models since a selection can be made from the gate resistances after the completion of switching elements 10, as described above. That is, a suitable selection from the gate resistances may be made to enable switching elements 10 to be used for a plurality of models using different numbers of switching elements 10 mounted in parallel with each other. Consequently, the productivity can be improved by simplifying the manufacturing management.

Figure 4:
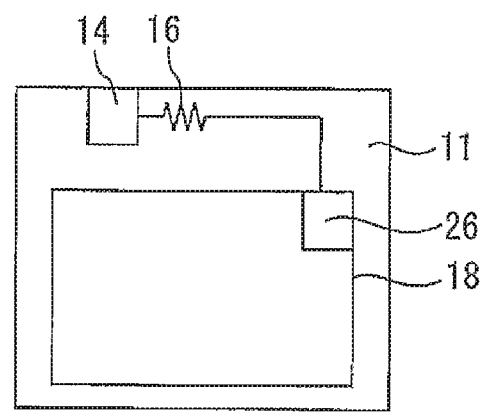
FIG. 4 is a plan view of a switching element according to a modified example.

FIG. 4 is a plan view of a switching element according to a modified example. A first gate pad 26 is formed in the cell region 18. More specifically, the first gate pad 26 is formed in a corner of the cell region 18. It is preferable that the first gate pad 26 be provided right above a gate wiring portion of the cell region 18.

Figure 5:
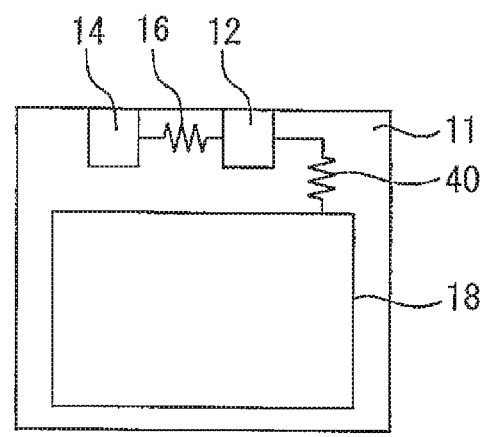
FIG. 5 is a plan view of a switching element using a resistor portion as the connecting part.

In a case where the first gate pad 12 exists outside the cell region 18, a connecting part for connecting the first gate pad 12 and the cell region 18 to each other is required. In the switching element 10 shown in FIG. 1, the wiring 20 is used as this connecting part. However, a resistor portion may alternatively be formed as this connecting part. FIG. 5 is a plan view of a switching element using a resistor portion 40 as the connecting part. The connecting part is formed of the resistor portion 40. In this case, an aluminum wire may be fixed to the first gate pad 12 to enable the resistor portion 40 to be used as an on-chip resistor. If an aluminum wire is fixed to the second gate pad 14, a series resistor formed of the first resistor portion 16 and the resistor portion 40 can be used as an on-chip resistor.

The switching element 10 is not limited to the IGBT. For example, a power MOSFET may form a switching element. The substrate 11 may be formed of a wide-bandgap semiconductor. The wide-bandgap semiconductor is, for example, silicon carbide, a gallium nitride-based material or diamond. In some high-speed switching use, a switching element may be formed of a wide-bandgap semiconductor. In such a case, uniformity of the gate resistance values of a plurality of switching elements may be checked by the above-described method to enable a semiconductor device to be operated with stability. These modifications can also be applied to switching elements, semiconductor devices and semiconductor device manufacturing methods according to embodiments described below.

Embodiment 2

A switching element, a semiconductor device and a semiconductor device manufacturing method according to Embodiment 2 of the present invention have a number of commonalities with Embodiment 1 and will therefore be described mainly with respect to points of difference from Embodiment 1. FIG. 6 is a plan view of a switching element 30 according to Embodiment 2 of the present invention. The switching element 30 includes a third gate pad 32 formed on the substrate 11. The second gate pad 14 and the third gate pad 32 are connected to each other by a second resistor portion 34 formed on the substrate 11.

A method of manufacturing the semiconductor device according to Embodiment 2 of the present invention will be described. First, the switching element 30 is manufactured. Next, the resistance value of the first resistor portion 16 is measured by setting probes to the first gate pad 12 and the second gate pad 14. Subsequently, the resistance value of the second resistor portion 34 is measured by setting probes to the second gate pad 14 and the third gate pad 32. Subsequently, the series resistance value of the first resistor portion 16 and the second resistor portion 34 is measured by setting probes to the first gate pad 12 and the third gate pad 32.

Subsequently, if the three measured resistance values meet standards, the switching element 30 is mounted in a module. An aluminum wire is fixed to any one of the first gate pad 12, the second gate pad 14 and the third gate pad 32.

Let the resistance value of the first resistor portion 16 be R1 and let the resistance value of the second resistor portion 34 be R2. When the aluminum wire is fixed to the third gate pad 32, the second resistor portion 34 and the first resistor portion 16 can be used as an on-chip resistor. The gate resistance value in this case is R1+R2. When the aluminum wire is fixed to the second gate pad 14, the first resistor portion 16 can be used as an on-chip resistor. The gate resistance value in this case is R1. When the aluminum wire is fixed to the first gate pad 12, the switching element can be formed with no on-chip resistor. A desired one of the three gate resistance values can thus be selected.

In Embodiment 2 of the present invention, the three resistance values (the resistance value of the first resistor portion 16, the resistance value of the second resistor portion 34 and the series resistance value of the first resistor portion 16 and the second resistor portion 34) are measured by setting the probes to the gate pads. However, if it is known in advance, for example, that the aluminum wire is fixed to the second gate pad 14, only the resistance value of the first resistor portion 16 may be measured and measurements on the other portions may be omitted. Also in the embodiments described below, measurement of the resistance values of the resistor portions known in advance not to be used may be omitted.

Embodiment 3

A switching element, a semiconductor device and a semiconductor device manufacturing method according to Embodiment 3 of the present invention have a number of commonalities with Embodiment 1 and will therefore be described mainly with respect to points of difference from Embodiment 1. FIG. 7 is a plan view of a switching element 50 according to Embodiment 3 of the present invention. The switching element 50 includes a first additional gate pad 52 formed on the substrate 11. The first additional gate pad 52 and the first gate pad 12 are connected to each other by a first additional resistor portion 54 formed on the substrate 11.

A method of manufacturing the semiconductor device according to Embodiment 3 of the present invention will be described. First, the switching element 50 is manufactured. Next, the resistance value of the first resistor portion 16 is measured by setting probes to the first gate pad 12 and the second gate pad 14. Subsequently, the resistance value of the first additional resistor portion 54 is measured by setting probes to the first gate pad 12 and the first additional gate pad 52. Further, the parallel resistance value of the first resistor portion 16 and the first additional resistor portion 54 is measured by setting probes to the first gate pad 12, the second gate pad 14 and the first additional gate pad 52.

Subsequently, if the above-described three resistance values meet standards, the switching element 50 is mounted in a module. An aluminum wire is fixed to the first gate pad 12, the second gate pad 14, the first additional gate pad 52 or both the second gate pad 14 and the first additional gate pad 52.

Let the resistance value of the first resistor portion 16 be R1 and let the resistance value of the first additional resistor portion 54 be $R_A1$. When the aluminum wire is fixed to the second gate pad 14, the first resistor portion 16 can be used as an on-chip resistor. The gate resistance value in this case is R1. When the aluminum wire is fixed to the first additional gate pad 52, the first additional resistor portion 54 can be used as an on-chip resistor. The gate resistance value in this case is $R_A1$. When the aluminum wire is fixed to the first gate pad 12, the switching element can be formed with no on-chip resistor.

When the aluminum wire is fixed to both the second gate pad 14 and the first additional gate pad 52, the first resistor portion 16 and the first additional resistor portion 54 connected in parallel with each other can be used as an on-chip resistor. The gate resistance value in this case is $(R1 \times R_A1)/(R1+R_A1)$. A desired one of the four gate resistance values can thus be selected by only selecting from the ways of connecting the aluminum wire.

Embodiment 4

Figure 8:
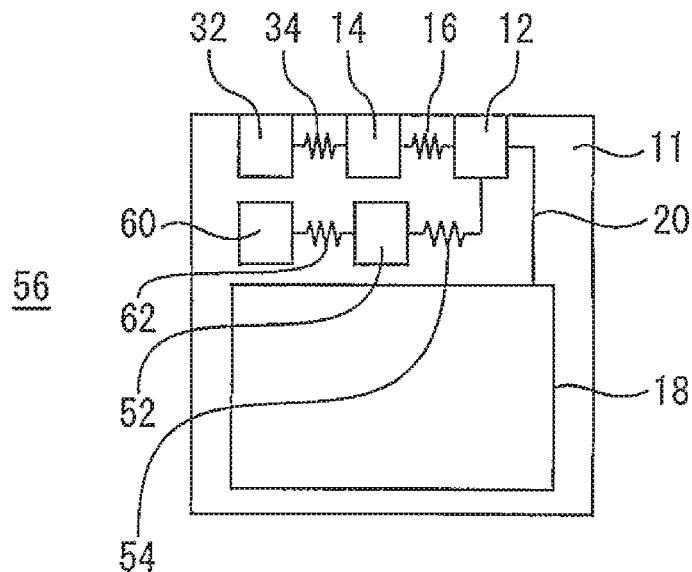
FIG. 8 is a plan view of a switching element according to Embodiment 4 of the present invention.

A switching element, a semiconductor device and a semiconductor device manufacturing method according to Embodiment 4 of the present invention have a number of commonalities with Embodiment 3 and will therefore be described mainly with respect to points of difference from Embodiment 3. FIG. 8 is a plan view of a switching element 56 according to Embodiment 4 of the present invention. The switching element 56 includes a second additional gate pad 60 formed on the substrate 11. The second additional gate pad 60 and the first additional gate pad 52 are connected to each other by a second additional resistor portion 62 formed on the substrate 11.

While the switching element described in Embodiment 3 is capable of providing four gate resistance values, the switching element 56 according to Embodiment 4 is capable of providing five gate resistance values in addition to these four gate resistance values. If the resistance value of the second resistor portion 34 is R2 and the resistance value of the second additional resistor portion 62 is $R_A2$, the five gate resistance values newly provided are as shown below.

First, when the aluminum wire is fixed to the third gate pad 32, the gate resistance value is R1+R2. Second, when the aluminum wire is fixed to the second additional gate pad 60, the gate resistance value is $R_A1+R_A2$. Third, when the aluminum wire is fixed to the third gate pad 32 and to the second additional gate pad 60, the gate resistance value is $((R2+R1) \times (R_A2+R_A1))/((R2+R1)+(R_A2+R_A1))$.

Fourth, when the aluminum wire is fixed to the third gate pad 32 and to the first additional gate pad 52, the gate resistance value is $((R2+R1) \times R_A1)/((R2+R1)+R_A1)$. Fifth, when the aluminum wire is fixed to the second gate pad 14 and to the second additional gate pad 60, the gate resistance value is $(R1 \times (R_A2+R_A1))/(R1+(R_A2+R_A1))$.

In a method of manufacturing the semiconductor device according to Embodiment 4 of the present invention, the above-described nine resistance values are measured after the switching element 56 is completed. Subsequently, if the above-described nine resistance values meet standards, the switching element 56 is mounted in a module. The aluminum wire is fixed to the gate pad(s) so that any one of the nine resistance values is realized. A desired one of the nine gate resistance values can thus be selected by only selecting from the ways of connecting the aluminum wire.

Embodiment 5

Figure 9:
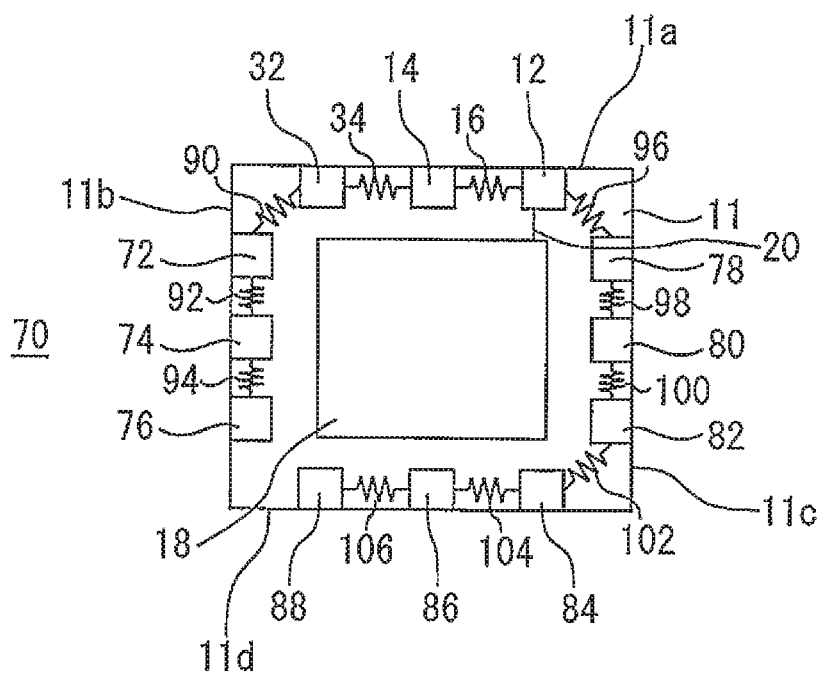
FIG. 9 is a plan view of a switching element according to Embodiment 5 of the present invention.

A switching element, a semiconductor device and a semiconductor device manufacturing method according to Embodiment 5 of the present invention will be described mainly with respect to points of difference from Embodiment 2. FIG. 9 is a plan view of a switching element 70 according to Embodiment 5 of the present invention. A feature of the switching element 70 resides in that a plurality of gate pads including the first gate pad 12 and the second gate pad 14 are formed in such a manner as to surround the cell region 18.

The switching element 70 is in the form of a rectangle having a first side 11a, a second side 11b, a third side 11c, and a fourth side 11d, as viewed in plan. First to third gate pads 12, 14, and 32 are formed along the first side 11a. The fourth to sixth gate pads 72, 74, and 76 are formed along the second side 11b. The seventh to ninth gate pads 78, 80, and 82 are formed along the third side 11c. The tenth to twelfth gate pads 84, 86, and 88 are formed along the fourth side 11d.

Each adjacent pair of gate pads is connected to each other by a resistor portion. That is, first to eleventh resistor portions 16, 34, 90, 92, 94, 96, 98, 100, 102, 104, and 106 are formed as shown in FIG. 9. However, the sixth gate pad 76 and the twelfth gate pad 88 are not connected to each other. Gate wiring including the gate resistor portions from the sixth gate pad 76 to the first gate pad 12 and gate wiring including the gate resistor portions from the twelfth gate pad 88 to the first gate pad 12 are connected in parallel with each other. After checking that the resistance values of the first to eleventh resistor portions 16, 34, 90, 92, 94, 96, 98, 100, 102, 104, and 106 meet standards, the switching element 70 is mounted in a package.

Thereafter, an aluminum wire is fixed to any one of the first to twelfth gate pads 12, 14, 32, 72, 74, 76, 78, 80, 82, 84, 86, and 88 or to the gate pad at one point in each of the above-described two gate wirings connected in parallel with each other (so that a desired resistance value is obtained). A desired one of the seventy-eight gate resistance values can be selected by only setting the resistance values of the resistor portions to different values and selecting from the ways of connecting the aluminum wire.

The number of gate pads, the gate pad disposition method, the number of resistor portions and the resistor portion disposition method can suitably be adjusted. A desired set of gate resistance values can be prepared by suitably adjusting these factors. That is, as long as a plurality of resistor portions connect a plurality of gate pads so that all the plurality of gate pads are electrically connected to the first gate pad, the number of resistor portions and the resistor position disposition method are not particularly limited.

Embodiment 6

Figure 10:
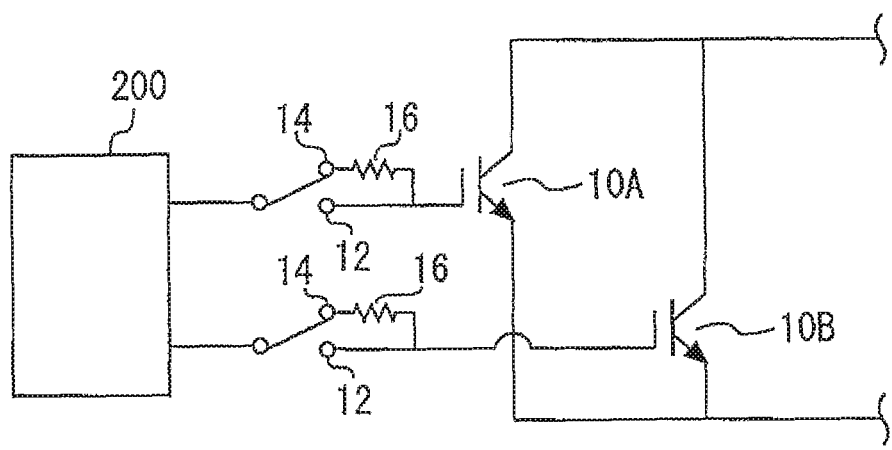
FIG. 10 is a circuit diagram of a semiconductor device according to Embodiment 6 of the present invention.

FIG. 10 is a circuit diagram of a semiconductor device according to Embodiment 6 of the present invention. This semiconductor device includes a first switching element 10A and a second switching element 10B. Each of the first switching element 10A and the second switching element 10B has the same configuration as the switching element 10 according to Embodiment 1. The first switching element 10A and the second switching element 10B are connected in parallel with each other.

Aluminum wires are fixed to the second gate pad 14 of the first switching element 10A and the second gate pad 14 of the second switching element 10B, thereby connecting these switching elements and a gate drive circuit 200 to each other. A control signal is transmitted from the gate drive circuit 200 to the cell region of the first switching element 10A via the first resistor portion 16 of the first switching element 10A. A similar control signal is transmitted from the gate drive circuit 200 to the cell region of the second switching element 10B via the first resistor portion 16 of the second switching element 10B.

The method described for Embodiment 1 ensures that the resistance value of the first resistor portion 16 of the first switching element 10A and the resistance value of the first resistor portion 16 of the second switching element 10B meet the standards. Current unbalance can thus be avoided. Also, the gate resistance for each switching element can be adjusted by selecting to which of the first gate pad 12 and the second gate pad 14 the aluminum wire is fixed. Accordingly, adaptation to a multiplicity of models can be achieved by selecting whether the control signals are supplied to the first gate pads 12 of the first switching element 10A and the second switching element 10B or to the second gate pads 14 of the first switching element 10A and the second switching element 10B.

The first switching element 10A and the second switching element 10B are not limited to the switching element 10 according to Embodiment 1. Any of the above-described switching elements may be adopted as each of the first switching element 10A and the second switching element 10B. The number of switching elements provided in parallel with each other is not limited to two. The number of the switching elements may be a number larger than two. In such a case, wires are connected to the first gate pads or the second gate pads of the plurality of switching elements in the above-described way. A suitable combination of the features of the switching elements according to the above-described embodiments may be made to improve the advantageous effects of the present invention.

DESCRIPTION OF SYMBOLS 10 switching element, 11 substrate, 12 first gate pad, 14 second gate pad, 16 first resistor portion, 18 cell region, 20 wiring, 22,24 aluminum wire, 26 first gate pad, 32 third gate pad, 34 second resistor portion, 40 resistor portion, 52 first additional gate pad, 54 first additional resistor portion, 60 second additional gate pad, 62 second additional resistor portion, 200 gate drive circuit

The invention claimed is:

1. A switching element comprising:
a substrate;
a first gate pad formed on the substrate;
a second gate pad formed on the substrate;

a first resistor portion formed on the substrate, the first resistor portion connecting the first gate pad and the second gate pad to each other; and a cell region formed on the substrate and connected to the first gate pad, wherein a wire can be fixed to the first gate pad and the second gate pad.

2. The switching element according to claim 1, further comprising:

a third gate pad formed on the substrate; and a second resistor portion formed on the substrate, the second resistor portion connecting the second gate pad and the third gate pad to each other.

3. The switching element according to claim 1, further comprising:

a first additional gate pad formed on the substrate; and a first additional resistor portion formed on the substrate, the first additional resistor portion connecting the first gate pad and the first additional gate pad to each other.

4. The switching element according to claim 3, further comprising:

a second additional gate pad formed on the substrate; and a second additional resistor portion formed on the substrate, the second additional resistor portion connecting the second additional gate pad and the first additional gate pad to each other.

5. The switching element according to claim 1, wherein the first gate pad is outside the cell region, and the switching element further comprises a connecting part formed on the substrate, the connecting part connecting the first gate pad and the cell region to each other.

6. The switching element according to claim 5, wherein the connecting part is formed of a piece of wiring.

7. The switching element according to claim 5, wherein the connecting part is formed of a resistor portion.

8. The switching element according to claim 1, further comprising:

a plurality of gate pads including the first gate pad and the second gate pad; and a plurality of resistor portions including the first resistor portion, the plurality of resistor portions connecting the plurality of gate pads so that all the plurality of gate pads are electrically connected to the first gate pad, wherein the plurality of gate pads are formed so as to surround the cell region.

9. The switching element according to claim 1, wherein the first gate pad is formed in the cell region.

10. The switching element according to claim 1, wherein the substrate is formed of a wide-bandgap semiconductor.

11. The switching element according to claim 10, wherein the wide-bandgap semiconductor is silicon carbide, a gallium nitride-based material or diamond.

12. A semiconductor device comprising:

a plurality of switching elements each including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad; and a plurality of wires respectively connected to the first gate pads or the second gate pads of the plurality of switching elements, each of the plurality of wires being capable of supplying a control signal, wherein a wire can be fixed to the first gate pad and the second gate pad.

13. A method of manufacturing a semiconductor device, comprising:

a step of manufacturing a switching element including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad;

a step of measuring the resistance value of the first resistor portion by setting probes to the first gate pad and the second gate pad; and a step of mounting the switching element in a module if the resistance value meets a standard, wherein a wire can be fixed to the first gate pad and the second gate pad.

14. A method of manufacturing a semiconductor device, comprising:

a step of manufacturing a plurality of switching elements each including a substrate, a first gate pad formed on the substrate, a second gate pad formed on the substrate, a first resistor portion formed on the substrate, the first resistor portion connecting the first gate pad and the second gate pad to each other, and a cell region formed on the substrate and connected to the first gate pad;

a step of measuring the resistance value of the first resistor portion with respect to each of the plurality of switching elements by setting probes to the first gate pad and the second gate pad; and a step of selecting one of the plurality of switching elements having the resistance value within a desired range and mounting the selected switching element in one semiconductor device, wherein a wire can be fixed to the first gate pad and the second gate pad.

* * * * *